United States Patent
Kwean

(10) Patent No.: US 7,755,959 B2
(45) Date of Patent: Jul. 13, 2010

(54) SEMICONDUCTOR MEMORY DEVICE WITH REDUCED NUMBER OF CHANNELS FOR TEST OPERATION

(75) Inventor: Ki-Chang Kwean, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 216 days.

(21) Appl. No.: 12/005,441

(22) Filed: Dec. 26, 2007

(65) Prior Publication Data
US 2008/0304345 A1 Dec. 11, 2008

(30) Foreign Application Priority Data
Jun. 8, 2007 (KR) .................. 10-2007-0055965

(51) Int. Cl.
 *G11C 29/00* (2006.01)
(52) U.S. Cl. .............. 365/201; 365/203; 365/189.11
(58) Field of Classification Search ........... 365/201, 365/203, 189.11, 63, 233, 185.05, 185.11, 365/230.08, 185.23, 230.06, 189.05
See application file for complete search history.

(56) References Cited

U.S. PATENT DOCUMENTS

| | | | |
|---|---|---|---|
| 5,796,745 A | 8/1998 | Adams et al. | |
| 6,070,256 A | 5/2000 | Wu et al. | |
| 6,292,415 B1 * | 9/2001 | Brehm | 365/201 |
| 6,360,344 B1 | 3/2002 | Khoche et al. | |
| 6,681,358 B1 | 1/2004 | Karimi et al. | |
| 7,034,560 B2 | 4/2006 | Farnworth et al. | |
| 2002/0067654 A1 * | 6/2002 | Grundon et al. | 365/233 |
| 2003/0016550 A1 * | 1/2003 | Yoo et al. | 365/63 |
| 2005/0251713 A1 | 11/2005 | Lee | |
| 2006/0262586 A1 * | 11/2006 | Solomon et al. | 365/63 |

FOREIGN PATENT DOCUMENTS

| | | |
|---|---|---|
| JP | 2001-296337 | 10/2001 |
| JP | 2002-022803 | 1/2002 |
| JP | 2005-322375 | 11/2005 |
| KR | 10-2000-0029619 A | 5/2000 |
| KR | 10-2007-0028064 A | 3/2007 |
| KR | 10-2007-0028067 A | 3/2007 |

* cited by examiner

*Primary Examiner*—Dang T Nguyen
(74) *Attorney, Agent, or Firm*—Blakely, Sokoloff, Taylor & Zafman LLP

(57) ABSTRACT

A semiconductor memory device includes a plurality of memory banks, a data pin for inputting and outputting data, and input/output buffers connected to the data pin. Each of the memory banks has a plurality of memory cells for storing the data. The data pin is enabled and disabled by a pin selection signal. The data pin performs a normal data input/output operation when the pin selection signal is enabled and a termination resistor connected to the data pin is off when the pin selection signal is disabled. The input/output buffers make a termination resistor connected to the data pin off when the pin selection signal is disabled.

14 Claims, 3 Drawing Sheets

SEMICONDUCTOR MEMORY DEVICE WITH REDUCED NUMBER OF CHANNELS FOR TEST OPERATION

CROSS-REFERENCE TO RELATED APPLICATION

The present invention claims priority of Korean patent application number 10-2007-0055965, filed on Jun. 08, 2007, which is incorporated by reference in its entirety.

BACKGROUND OF THE INVENTION

The present invention relates to a semiconductor memory device; and, more particularly, to improvements of a semiconductor memory device in test efficiency.

As well-known in the art, a semiconductor memory device is operated by receiving addresses, commands, data, etc. from a memory controller in its actual use. Upon test of the semiconductor memory device, it is connected to test equipment and tested by taking addresses, commands, data, etc. from the test equipment in order to check if it is normally operated.

FIG. 1 is a view showing an arrangement of data pins and banks in a conventional semiconductor memory device.

In FIG. 1, there is shown an x32 semiconductor memory device which outputs data using 32 data pins DQs. An entire chip is operated in x32, including 4 memory banks operating in x8. The arrangements of memory banks and data pins DQs may differ little by little depending on semiconductor memory devices, but a general case in which one bank uses 8 data pins is shown in FIG. 1 for illustration.

For reference, memory banks are regions with regular sizes into which a storage portion of a semiconductor memory device is divided for efficient operation of data, and are composed of a plurality of memory cells.

FIG. 2 illustrates the connection between the conventional semiconductor memory devices and test equipment.

As shown in the drawing, data pins of each of the conventional semiconductor memory devices and input/output (I/O) pins of the test equipment are connected in a one-to-one fashion. Thus, if the test equipment having 256 IO pins tests x32 semiconductor memory device, it can test up to 8 chips at the same time.

In such a semiconductor memory device, it is an important issue to reduce time and costs taken for its test. For this, it is required that a small capacity test equipment can test as many as possible chips at a time.

Consequently, there is a need for a technology capable of testing a large number of chips at a time even while using the same test equipment.

SUMMARY OF THE INVENTION

Embodiments of the present invention are directed to provide a semiconductor memory device for improving a test efficiency by reducing the number of data channels required for a test operation.

In accordance with an aspect of the present invention, there is provided a semiconductor memory device including a plurality of memory banks, a data pin for inputting and outputting data, and input/output buffers connected to the data pin. Each of the memory banks has a plurality of memory cells for storing the data. The data pin is enabled and disabled by a pin selection signal. The data pin performs a normal data input/output operation when the pin selection signal is enabled and a termination resistor connected to the data pin is off when the pin selection signal is disabled. The input/output buffers make a termination resistor connected to the data pin off when the pin selection signal is disabled. The input/output buffers include an input buffer and an output driver. The input buffer has an on die termination resistor. The output driver has pull-up and pull-down termination resistors. The input buffer and the output driver make their own termination resistors off in preference to other control signals when the pin selection signal is disabled.

In accordance with another aspect of the present invention, there is provided a semiconductor memory device including a plurality of memory banks and two or more data input/output groups. Each of the memory banks has a plurality of memory cells for storing data. Each of the data input/output groups has a plurality of data pins which input and output the data. The data pins are enabled or disabled under the control of a pin selection signal allocated to each of the data input/output groups.

In accordance with a further another aspect of the present invention, there is provided a semiconductor memory device including two or more data input/output groups. Each of the data input/output groups has a plurality of data pins. Different groups of the data input/output groups are connected in parallel to test equipment upon test. All the two or more data input/output groups accept data in parallel during a write operation, and each of the two or more data input/output groups sequentially outputs data during a read operation.

DESCRIPTION OF SPECIFIC EMBODIMENTS

Hereinafter, preferred embodiments of the present invention will be described in detail with reference to the accompanying drawings so that the invention can be easily carried out by those skilled in the art.

Data pins to be described later are used to input/output data stored in memory banks, i.e., memory cells, and the present invention is to reduce the number of data channels required for test. Therefore, first, a detailed description for the data pins will be given below.

Figure 1:
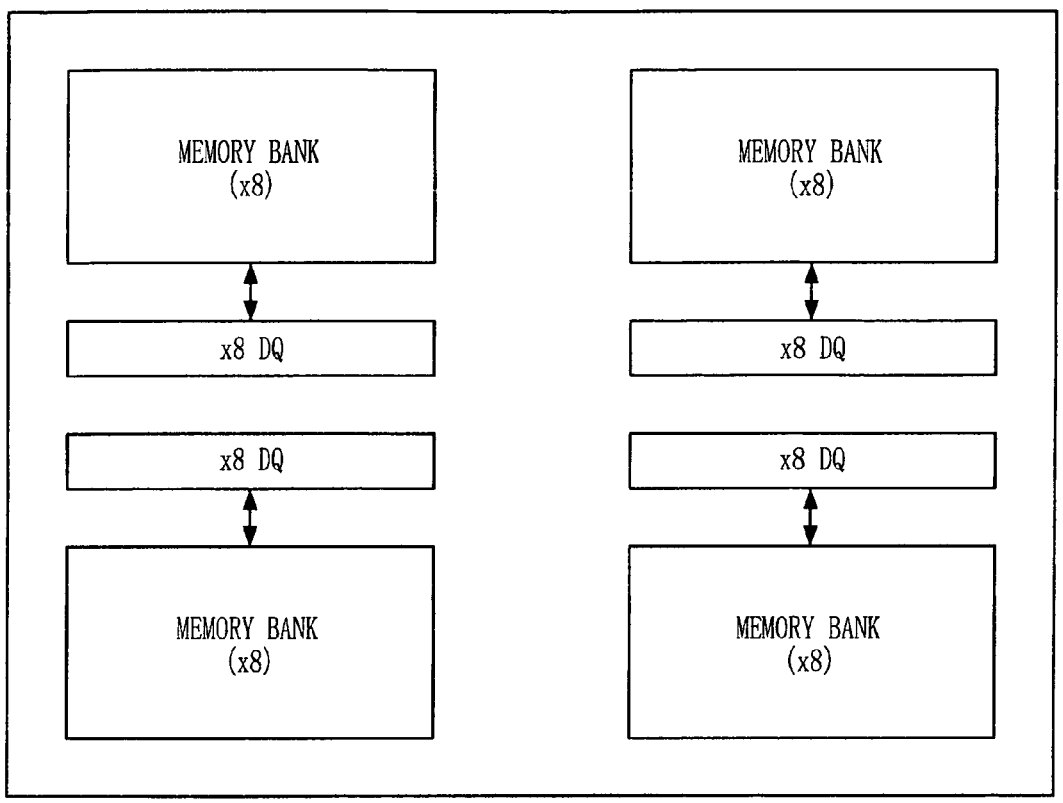
FIG. 1 is a view showing an arrangement of data pins and banks in a conventional semiconductor memory device.
Figure 2:
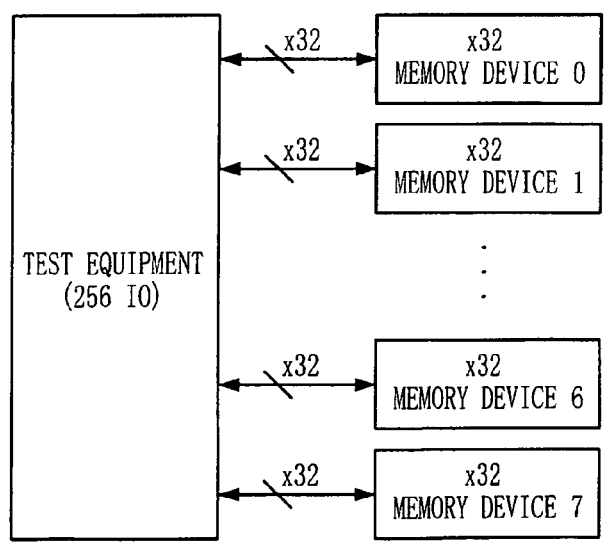
FIG. 2 illustrates the connection between the conventional semiconductor memory devices and test equipment.
Figure 3:
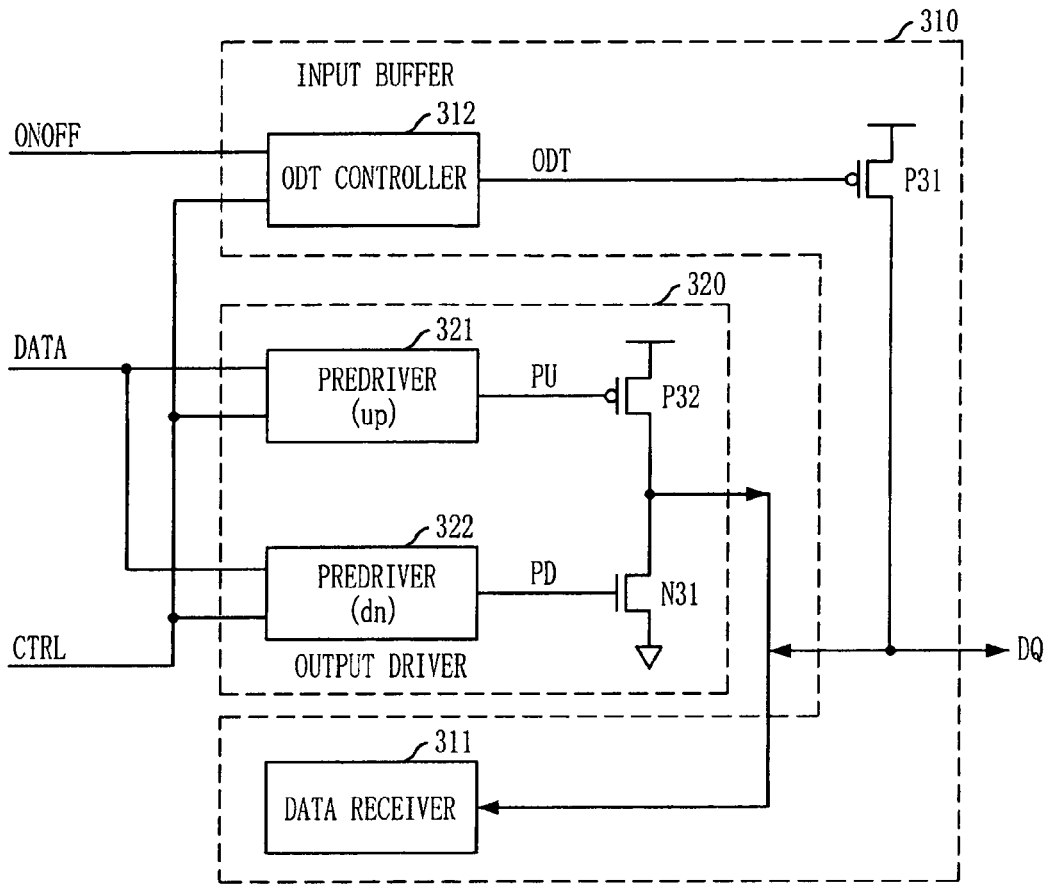
FIG. 3 is a diagram showing a data pin portion of a semiconductor memory device in accordance with the present invention.

FIG. 3 is a diagram showing a data pin portion of a semiconductor memory device in accordance with the present invention.

The semiconductor memory device of the present invention is characterized in that its pins DQs are enabled or disabled by a pin selection signal CTRL that is a test mode signal.

As will be discussed later, the present invention reduces the number of data channels required for test by using a technique that couples several data pins in parallel to the test equipment. Thus, it is required to control each of the several data pins DQs coupled in parallel to be enabled or disabled.

The disable of data pin DQ can be done by making termination resistors P31, P32, and N31 connected to the data pin DQ off. When the pin control signal CTRL controlling this is enabled, the data pin DQ performs a normal data input/output operation, and when it is disabled, the termination resistors P31, P32, and N31 connected to the data pin DQ are off.

More specifically, the termination resistors P31, P32, and N31 connected to the data pin DQ are provided in an input buffer 310 and an output driver 320. That is, the input buffer 310 is provided with an on die termination resistor P31 for terminating the data pin DQ to be pulled up, and the output driver 320 is provided with pull-up and pull-down termination resistors P32 and N31.

If it is first assumed that there is no pin selection signal CTRL, the operation is done as follows. The input buffer 310 is composed of a data receiver 311 receiving data, the on die termination resistor P31, and an on die termination (ODT) controller 312. In receipt of data, data is received through the data receiver 311, with the on die termination resistor P31 being on. The reason the on die termination resistor P31 is on upon receipt of data is to prevent impedance mismatching with the outside of chip.

The output driver 320 drives the pull-up and pull-down termination resistors P32 and N31 by predrivers 321 and 322 arranged at up and down sides thereof and outputs data. In case of outputting high data, the pull-up termination resistor P32 is on to make the data pin DQ in a high state to output high data, while in case of outputting low data, the pull-down termination resistor N31 is on to output low data.

Although only transistors are illustrated as the termination resistors P31, P32 and N31 in the drawing, they are transistors that operate as resistors, rather than simply perform on/off functions. Therefore, the transistors P31, P32, and N31 shown in the drawing may be a combination of transistors that perform on/off functions and resistors connected in series thereto.

Now, the operation of controlling the input buffer 310 and the output driver 320 by the pin selection signal CTRL will be described. The pin selection signal CTRL enabled means that the corresponding pin is enabled. At this time, the input buffer and the output driver perform the original operation as mentioned above.

However, when the pin selection signal CTRL is disabled, the pin selection signal CTRL causes signals at ODT, PU, and PD ends to get logic high, logic high, and logic low, respectively, in the drawing. Thus, all the termination resistors P31, P32, and N31 become off. This state indicates just a state that the data pin DQ is disabled. In this state, the output driver 320 is under a state that the pull-up and pull-down termination resistors P32 and N31 are off and thus cannot output high or low data. And, the input buffer 310 cannot receive correct data although the on die termination resistor P31 is off and the data receiver 311 is normally operated.

Figure 4:
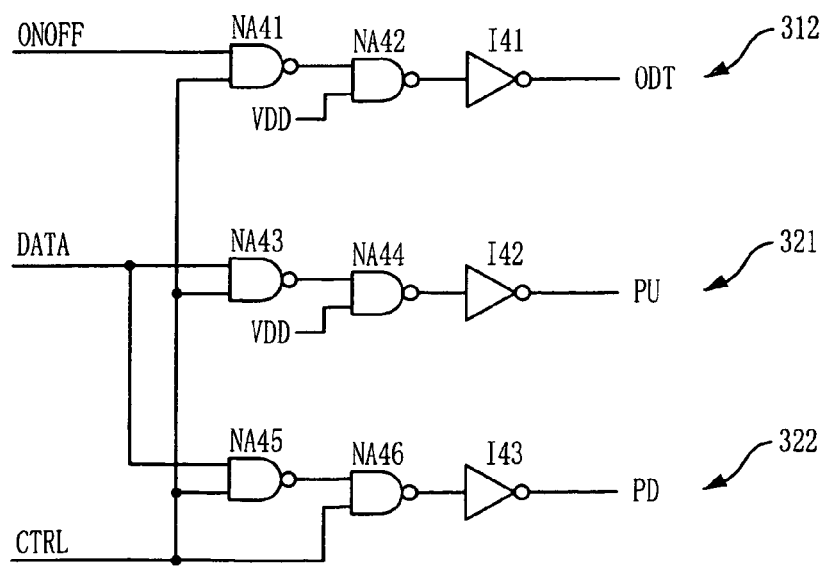
FIG. 4 shows a detailed circuit diagram of the on die termination controller and the up/down predrivers of FIG. 3.

FIG. 4 shows a detailed circuit diagram of the on die termination controller 312 and the up/down predrivers 321 and 322 of FIG. 3.

As shown therein, the on die termination controller 312 and the up/down predrivers 321 and 322 are provided with NAND gates NA41 to 46, and inverters I41 to 43, respectively.

First, the operation of the on die termination controller 312 will be described. With the pin selection signal CTRL enabled to logic high, when the level of an ONOFF signal is logic high, the inverter I41 outputs a logic low signal, thereby making the on die termination resistor P31 of FIG. 3 on. When the level of an ONOFF signal is logic low, the inverter I41 output a logic high signal, thereby making the on die termination resistor P31 of FIG. 3 off. However, when the pin selection signal CTRL is disabled to logic low, the output of the NAND gate NA41 is logic high regardless of the level of the ONOFF signal. Thus, the output of the NAND gate NA42 is logic low and thus the output of the inverter I41 is logic high, thereby making the on die termination resistor P31 of FIG. 3 off.

In operation of the up predriver 321, with the pin selection signal CTRL enabled to logic high, when the level of output data DATA is logic high, the output of the inverter I41 becomes logic low, thereby making the pull-up termination resistor P32 of FIG. 3 on. When the level of the output data DATA is logic low, the output of the inverter I41 becomes logic high, thereby making the pull-up termination resistor P32 of FIG. 3 off. However, when the pin selection signal CTRL is disabled to logic low, the output of the NAND gate NA43 becomes logic high regardless of the level of the output data DATA and thus the output of the inverter I42 becomes logic high, thereby making the pull-up termination resistor P32 of FIG. 3 off.

In operation of the down predriver 322, with the pin selection signal CTRL enabled to logic high, the level at the output end of the inverter I43 is varied depending on the level of the output data DATA. However, when the pin selection signal CTRL is disabled, the output of the inverter I43 becomes logic low regardless of the level of the output data DATA, thereby making the pull-down termination resistor N31 of FIG. 3 off.

To sum up, in a state that the pin selection signal CTRL is enabled, the levels at the ODT, PU, and PD ends are varied depending on the logic levels of the ONOFF signal and DATA, while in a state that the pin selection signal CTRL is disabled, the levels at the ODT, PU, and PD ends are fixed to logic high, logic high, and logic low, respectively, regardless of the logic levels of the ONOFF signal and DATA.

Figure 5:
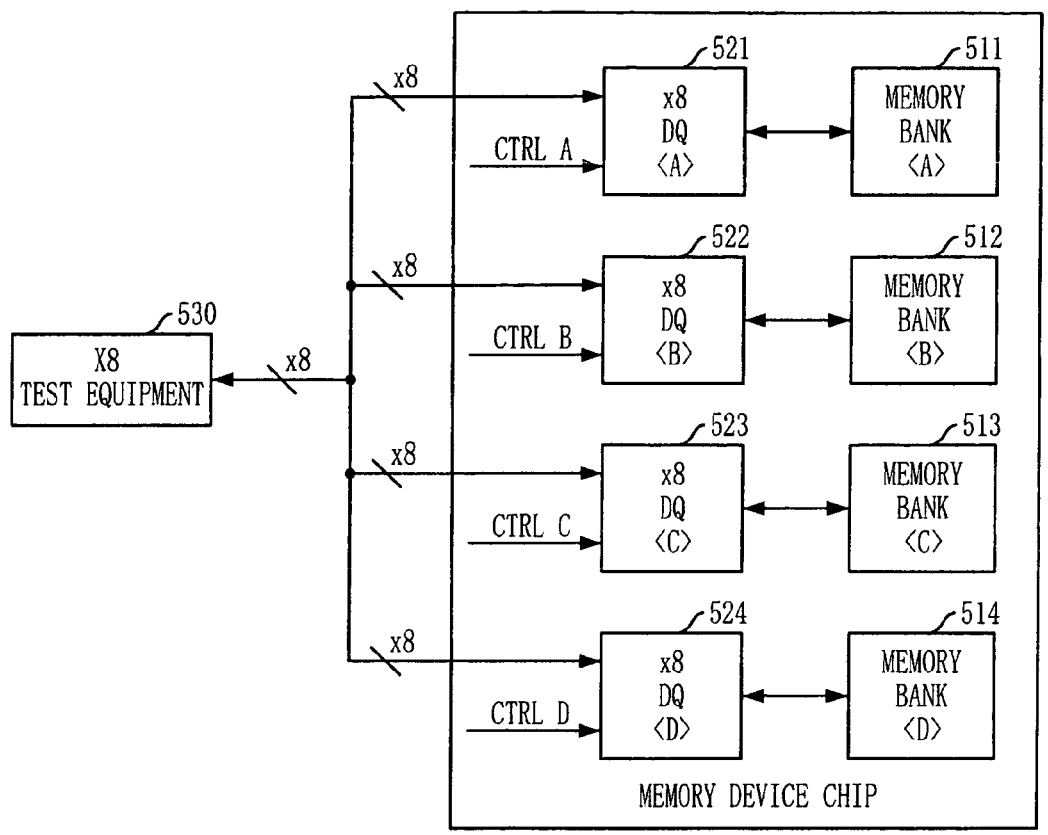
FIG. 5 is a block diagram showing the configuration of a semiconductor memory device in accordance with a preferred embodiment of the present invention.

FIG. 5 is a block diagram showing the configuration of a semiconductor memory device in accordance with a preferred embodiment of the present invention.

As shown in the drawing, the semiconductor memory device in accordance with the present invention includes a plurality of memory banks 511, 512, 513, and 514 having a plurality of memory cells for storing data, and two or more data input/output groups 521, 522, 523, and 524, each having a plurality of data pins DQs. The plurality of data pins DQs are characterized by being enabled or disabled under the control of pin selection signals CTRL A, CTRL B, CTRL C, and CTRL D allocated to the respective data input/output groups 511, 512, 513, and 514.

The semiconductor memory device of the present invention has the data input/output groups 521, 522, 523, and 524 composed of pairs of plural data pins DQs. For example, as shown in the drawing, x32 semiconductor memory device has 4 data input/output groups A to D 521, 522, 523, and 524 composed of pairs of 8 data pins DQs. And the pin selection signals CTRL B, CTRL C, and CTRL D as mentioned above are allocated to the respective data input/output groups 521, 522, 523, and 524. Thus, the data pins DQs in the A group 521 are simultaneously enabled or disabled under of the control of the pin selection signal CTRL A, and the data pins DQs in the B group 522 are simultaneously enabled or disabled by the control of the pin selection signal CTRL B. Of course, these data pins DQs are the ones which can be disabled by the pin selection signal CTRL described in FIGS. 3 and 4.

The semiconductor memory device of the present invention having the configuration as above uses a smaller number of data channels than that in the normal operation upon test.

In the semiconductor memory device of the present invention, the data input/output groups 521, 522, 523, and 524 are connected in parallel to the test equipment 530. As shown in the drawing, if there are the 4 data input/output groups 521, 522, 523, and 524, pairs of 4 data pins DQs are connected in parallel to the test equipment. For example, the first pin in the A group 521 is connected in parallel to the first pin of each of the B, C, and D groups 522, 523, and 524, and the second pin of the A group 521 is connected in parallel to the second pin of each of the B, C, and D groups 522, 523, and 524.

In a write operation upon test, in a state that one of the pin selection signals CTRL A, CTRL B, CTRL C, and CTRL D is enabled, data is received from the test equipment 530. Then, the data is written on all the data input/output groups 521, 522, 523, and 524. As mentioned above, the on die termination resistor P31 of FIG. 3 of the input buffer 310 of FIG. 3 connected to the data pin is enabled or disabled depending on the pin selection signal CTRL. The on die termination resistor is to solve impedance mismatching, and only when it is on, the input buffer can normally accept data. As shown in the drawing, in case the groups 521, 522, 523, and 524 are connected in parallel to the test equipment 530, when only the on die termination resistor of one group is on, the impedance mismatching problem is solved. Thus, even when only the pin selection signal CTRL of one group is enabled, the input buffer connected to the data pins of all the groups can normally receive data. In this case, when the pin selections signals CTRL A, CTRL B, CTRL C, and CTRL D) of the all the groups 521, 522, 523 and 524 are enabled, impedance does not rather match, thereby making it impossible to receive data.

Unlike the write operation, a read operation upon test is performed separately for each of the groups 521, 522, 523, and 524. For example, in a state that the pin selection signal CTRL A is enabled, the read operation of the data input/output group A 521 is performed, and in a state that the pin selection signal CTRL B is enabled, the read operation of the data input/output group B 522 is performed. The output driver 320 of FIG. 3 connected to each of the data pins DQs of each group enables its own pull-up or pull-down termination resistor P32 or N31 to be on only when the pin selection signal CRTL is enabled, and enables the logic level of the DQ pin to be logic high or low only when it makes the pull-up or pull-down termination resistor P32 or N31 on.

To sum up, the semiconductor memory device in accordance with the present invention includes the two or more data input/output groups 521, 522, 523, and 524, each having the plurality of data pins DQs. Upon test, out of the two or more data input/output groups 521, 522, 523, and 524, different groups are connected in parallel to the test equipment 530. And during the write operation, all the data input/output groups 521, 522, 523, and 523 receive data in parallel at the same time, and during the read operation, each of the data input/output groups sequentially outputs data.

To be more specific, in case of performing the write operation upon test, data is written in parallel, with only the on die termination resistor provided in each of the plurality of data pins of one data input/output group, e.g., 521, being on by enabling only the pin selection signal, e.g., CTRL A, allocated to one data input/output group, e.g., 521.

Further, in case of carrying out the read operation upon test, read operation is sequentially done for each group, in a state that only the selection signal, e.g., CTRL A, of one group is enabled, only the output driver provided in each of the plurality of data pins of one group, e.g., 521, is enabled and the pull-up and pull-down termination resistors provided in each of the plurality of data pins of the remaining data input/output groups 522, 523, and 524 are off.

As described above, since the semiconductor memory device in accordance with the present invention performs the read/write operations by using a smaller number of data channels than that in the normal operation upon test, it is possible for one test equipment to test more data chips at a time, which reduces test time and test costs.

The following is a detailed description for setting of the pin selection signals CTRL A, CTRL B, CTRL C, and CTRL D, which are test mode signals. The pin selection signals CTRL A, CTRL B, CTRL C, and CTRL D should be always enabled so that the data pins can normally operate in the normal operation. When performing the write operation upon test, only one of the pin selection signals CTRL A, CTRL B, CTRL C, and CTRL D needs to be enabled. This is because all the data input/output groups 521, 522, 523, and 524 simultaneously perform the write operation, and thus even if only the pin selection signal of one data input/output group is enabled, all the data input/output groups 521, 522, 523, and 524 can normally perform the write operation. Upon test, since the read operation is performed separately for each of the data input/output groups 521, 522, 523, and 524, the test is carried out by sequentially enabling the pin selection signals CTRL A, CTRL B, CTRL C, and CTRL D.

As well-known in the art, this pin selection signal CTRL as the test mode signal is set by MRS setting, or created by input from the outside. Since setting the pin selection signal like this is obvious to those skilled in the art that, further description thereof will be omitted here.

For reference, although the data pins DQs that are in charge of one memory bank 511, 512, 513, or 514 are shown in FIG. 5 to constitute one data input/output group 521, 522, 523, or 524, this is only for one illustration and pins of different banks may form one data input/output group.

Figure 6:
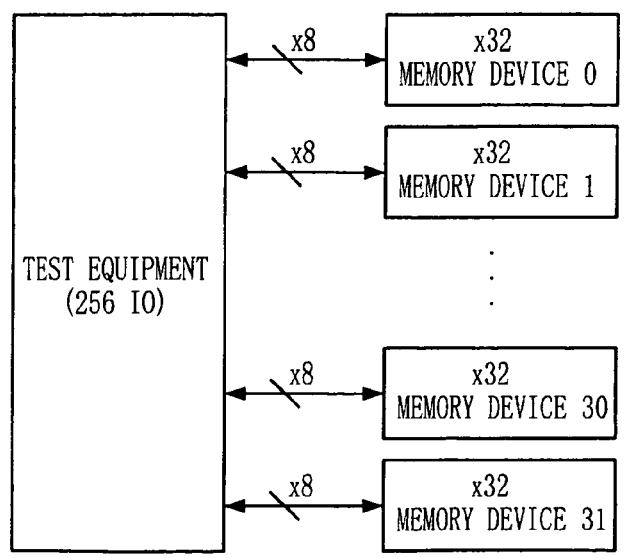
FIG. 6 shows an example that plural x32 semiconductor memory devices are connected to single x256 test equipment.

FIG. 6 shows an example that plural x32 semiconductor memory devices are connected to one x256 test equipment.

By the present invention, even x32 semiconductor memory device may be connected to the test equipment in x8 upon test. Therefore, 32 x32 semiconductor memory devices may be connected to the test equipment with 256 IOs. This has quadruple efficiency as compared to the prior art.

As described above, in accordance with a semiconductor memory device of the present invention, since data pins can be set to be enabled or disabled, plural data pins can be connected in parallel to test equipment upon test.

Therefore, the number of data channels required for test can be reduced, and one test equipment can simultaneously test more chips. As a result, this can decrease test time and test costs in manufacturing the semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
 a plurality of memory banks having a plurality of memory cells for storing data;
 data pins which input and output the data and are enabled or disabled by a pin selection signal; and
 termination resistors connected to the data pins,
 wherein one of the termination resistors connected to a corresponding one of the data pins is on when the memory bank connected to the corresponding data pin performs read/write operations, and the other termination resistors connected to the other data pins are off.

2. The semiconductor memory device of claim 1, wherein the corresponding data pin performs a normal data input/ output operation when the pin selection signal is enabled and the termination resistor connected to the corresponding data pin is off when the pin selection signal is disabled.

3. The semiconductor memory device of claim 1, further comprising input/output buffers connected to the data pins, wherein the input/output buffers make a the termination resistor connected to the corresponding data pin off when the pin selection signal is disabled.

4. The semiconductor memory device of claim 3, wherein the input/output buffers include:
an input buffer having an on die termination resistor; and
an output driver having pull-up and pull-down termination resistors, and
the input buffer and the output driver make their own termination resistors off in preference to other control signals when the pin selection signal is disabled.

5. A semiconductor memory device comprising:
a plurality of memory banks having a plurality of memory cells for storing data; and
two or more data input/output groups, each having a plurality of data pins which are each connected to a corresponding termination resistor and input and output the data, and
wherein the plurality of data pins are enabled or disabled under the control of a pin selection signal allocated to each of the data input/output groups, and
the corresponding termination resistor connected to the data pin is on when the data input/output group corresponding to the data pin, performs a normal data input/output operation, and the other termination resistors connected to the other data pins are off.

6. The semiconductor memory device of claim 5, wherein the plurality of data pins perform the normal data input/output operation when the pin selection signal is enabled and the corresponding termination resistor connected to the data pin is off when the pin selection signal is disabled.

7. The semiconductor memory device of claim 5, further comprising input/output buffers connected to each of the plurality of data pins,
wherein the input/output buffers make the termination resistor connected to the data pin off when the pin selection signal is disabled.

8. The semiconductor memory device of claim 7, wherein each of the input/output buffers include:
an input buffer having an on die termination resistor; and
an output driver having pull-up and pull-down termination resistors, and
wherein the input buffer and the output driver makes their own termination resistors off in preference to other control signals when the pin selection signal is disabled.

9. A semiconductor memory device comprising:
two or more data input/output groups, each having a plurality of data pins each connected to a corresponding termination resistor,
wherein different groups of the two or more data input/output groups are connected in parallel to test equipment upon test,
all the two or more data input/output groups accept data in parallel during a write operation, and each of the two or more data input/output groups sequentially outputs data during a read operation, and
the corresponding termination resistor connected to the data pin is on when the data input/output group, corresponding to the data pin, performs the write/read operations, and the other termination resistors connected to the other data pins are off.

10. The semiconductor memory device of claim 9, wherein only an on die termination resistor provided in each of a plurality of data pins of one of the data input/output groups is on when performing the write operation upon test.

11. The semiconductor memory device of claim 10, wherein only one output driver provided in each of a plurality of data pins of one of the data input/output groups is enabled when performing the read operation upon test, and pull-up and pull-down termination resistors of an output driver provided for each of the plurality of data pins of the remaining data input/output groups are off.

12. The semiconductor memory device of claim 11, wherein the on/off operations of the on die termination resistor and the pull-up and pull-down termination resistors are controlled by a pin selection signal allocated to each of the data input/output groups.

13. The semiconductor memory device of claim 12, wherein the on die termination resistor and the pull-up and pull-down termination resistors are off in preference to other control signals when the pin selection signal is disabled.

14. The semiconductor memory device of claim 9, wherein one of the data input/output groups is assigned for data input/output of one memory bank.

* * * * *